United States Patent [19]

Matsumoto et al.

[11] 4,289,575
[45] Sep. 15, 1981

[54] METHOD OF MAKING PRINTED WIRINGBOARDS

[75] Inventors: Masashige Matsumoto; Hideaki Kobuna; Seiji Hiraide; Kouichi Kawai, all of Tokyo, Japan

[73] Assignee: Nippon Electric Co., Ltd., Tokyo, Japan

[21] Appl. No.: 87,713

[22] Filed: Oct. 24, 1979

[30] Foreign Application Priority Data

Oct. 30, 1978 [JP] Japan .................................. 53-133423

[51] Int. Cl.³ .......................... H05K 3/06; H05K 3/26
[52] U.S. Cl. .................................. 156/656; 156/659.1; 204/15; 204/23; 204/32 R
[58] Field of Search .................. 204/15, 20, 23, 32 R, 204/46 G, 49; 156/656, 659.1, 661.1; 29/625, 630 R; 427/96, 99

[56] References Cited

U.S. PATENT DOCUMENTS

| 2,834,723 | 5/1958 | Robinson | 204/15 |
| 3,475,284 | 10/1969 | Olson | 204/15 |
| 3,483,615 | 12/1969 | Gottfried | 156/61.1 |
| 3,747,210 | 7/1973 | Kroll | 29/625 |
| 3,850,711 | 11/1974 | Conley | 156/661.1 |
| 3,904,492 | 9/1975 | Rich | 29/625 |
| 4,104,111 | 8/1978 | Mack | 156/656 |
| 4,179,800 | 12/1979 | Takaba et al. | 156/656 |

Primary Examiner—Jerome W. Massie
Attorney, Agent, or Firm—Thompson, Birch

[57] ABSTRACT

A predetermined portion of a wiring substrate having wiring patterns obtained by etching a copper layer formed on an insulating substrated is covered with a plating resistant first insulating film, then a portion of lead patterns is covered by a removable and plating resistance second film. Then overplated coating is applied onto predetermined wiring patterns and thereafter the second film is removed. Thereafter only lead patterns are selectively etched off.

7 Claims, 16 Drawing Figures

METHOD OF MAKING PRINTED WIRINGBOARDS

BACKGROUND OF THE INVENTION

This invention relates to a printed wiring board and manufacturing method thereof, and more particularly to a printed wiring board for use in an electronic wrist watch, which requires an extremely high accuracy of circuit pattern.

Recently, the electronic wrist watch has become popular. In such wrist watch, a miniaturized printed wiring board is used combined with a semiconductor device such as integrated circuit (IC) and large scale integrated circuit (LSI). The semiconductor device must be electrically connected to an array of contact regions on the wiring board. Therefore, it is required to arrange the contact regions accurately and at a high density around the semiconductor device. The electrical connections between the contact regions and corresponding contact pads of the device are performed by a wire bonding method using fine metal line such as gold and aluminum. To meet this method, the contact regions, which are generally made of copper, are electroplated with desired metal as an overplated coating.

The invention contemplates effective solution of various problems involved in such overplating technique.

In the overplating technique, such novel metals as gold, gold on nickel, are used. However, since such novel metals are expensive it is necessary to minimize the quantity of the overplated metal.

A typical prior art method of overplating will firstly be described with reference to FIGS. 1a through 1e.

According to the prior art method, as shown in FIG. 1a, a conductive metal pattern 12 is formed on a desired portion of an insulating substrate 11 by an ordinary method of making printed wiring board. The conductive pattern 12 can be divided into two areas. One is a circuit area and the other is an electroplating current supply area. The circuit area includes contact regions to be overplated which are indicated as contact tabs A1, A2, A3, A4 and C, and lands B1, B2 and B3. The circuit area further includes circuit leads designated as D2 and D3. On the other hand, the electroplating current supply area consists of electroplating leads designated as E, D1, D4, D5, D6 and D7.

In the next step, a conventional plating resistant organic insulating film, is selectively coated on the substrate except for the contact regions A, B and C, and electroplating lead E as shown by a shaded area in FIG. 1b.

Then, as shown in FIG. 1c, an overplated plating 14, which consists of gold, solder or double layers of gold on nickel is formed on the exposed contact regions A, B and C and an exposed portion of the electroplating lead E. The plating current is supplied through the electroplating lead E formed on a margin area to be removed in the product.

Thereafter, a mechanical cutting operation is performed on the wiring board to isolate the tabs A1 to A4 and C from each other, in addition to the isolation of the lands B1 and B2 from the lead E. Of the resist film 13 is an adhesive tape coated with an adhesive agent, it is required to be removed before the mechanical cutting operaton. In the above drawings, it is assumed that an organic insulating film is used to avoid the peeling process of the film 13. In FIG. 1d, drilling or press punching is used to form six openings 161 to 166 at the connecting portions between the leads D1 and D4 to D7, and between the lead E and the lands B1 and B2.

In FIG. 1e, on the other hand, a milling cutter process is used to form an elongated slot 17 along the lead D1, while removing the lead E along a dotted line designated as F.

However, the cutting operation described above accompanies the following problems.

When a drill is used, the drill is rotated in one direction and advanced into the substrate 11 in a direction perpendicular to the surface of the metal pattern 12. Thus, as shown in FIG. 2c, "burrs" or "beards" 12a and 12b are formed on the walls of the openings in a rotating direction of the drill due to the viscosity of metal. For this reason, it becomes harder to electrically isolate the tabs A1 to A4 from each other unless the diameter of each opening is enlarged.

Furthermore, since the substrate 11 usually consists of glass-epoxy laminate, irregularities 11a are formed on the walls of the drilled opening. In a microscopic view, the laminated glass clothes and the synthetic resin films are separated due to mechanical shock applied at the time of drilling, thus imparing the characteristics of the insulating substrate. In the same manner, the milling cutter forms irregularities 11a' and burrs on beards 12a' on the wall surface as shown in FIG. 2b. Therefore, it is inevitable to cause the aforementioned shortcomings.

When a press punching is used instead of the drill, beards and burrs 12a'' and 12b'' are also formed downward on the walls of punched opening as shown in FIG. 2c and some of these irregularities are deeply extended.

If the insulating substrate 11 is thin, the metal patterns 12 on the upper and lower sides thereof are short-circuited through the punched opening or the effective diameter of the opening becomes smaller thus degrading the electrical characteristics of the insulating substrate.

When the printed wiring boards made by these prior art methods are used in a high humidity environment, there is a tendency of forming dew on the fractured surfaces because of their irregularity. Accordingly, electric insulaton strength between the metal patterns 12 is reduced unless the distances between these patterns are widely arranged.

Moreover, since the foregoing mechanical processes have a limit in its working accuracy, a time circuit pattern is hardly obtained.

SUMMARY OF THE INVENTION

Accordingly, one of the objects of this invention is to provide an improved method of making a printed wiring board having overplated contact regions.

Another object of this invention is to provide a miniaturized printed wiring board having a hollow portion surrounded by densely arranged overplated contact tabs.

According to this invention, a conductive metal pattern is formed on a substrate. The metal pattern consists of a desireded electric circuit pattern including terminals to be electroplated and an electroplating current supplying pattern which must be removed in later. A first resist film is selectively coated on the metal pattern except for the terminals and the electroplating current supplying region to be removed in later. A second film is selectively coated on the removing portions of the electroplating current supplying pattern. Then the exposed portion of the metal pattern are overplated.

Thereafter, the second film is removed and then the exposed unplated metal portions are removed.

At need, mechanical cutting is performed at the portion apart from the overplated portion.

DESCRIPTION OF THE PREFERRED EMBODIMENT

A preferred embodiment of this invention will now be described with reference to FIGS. 3a through 3f, FIGS. 4 and FIG. 5.

Figure 1A:
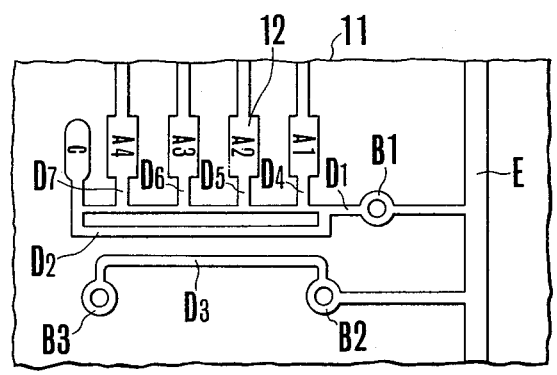
FIGS. 1a through 1e are partial plan views showing a typical prior art method of making a printed wiring board with an overplated coating.
Figure 1B:
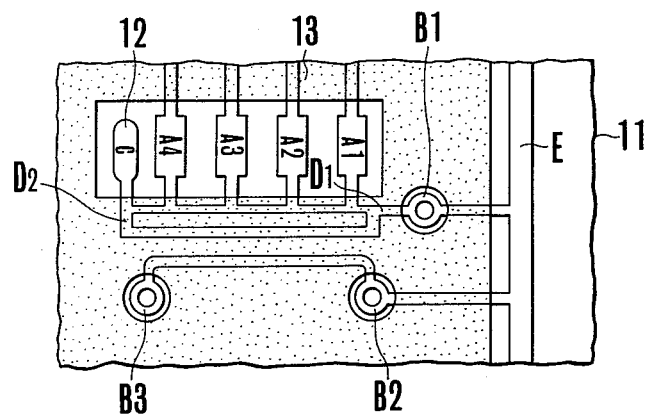
Figure 1C:
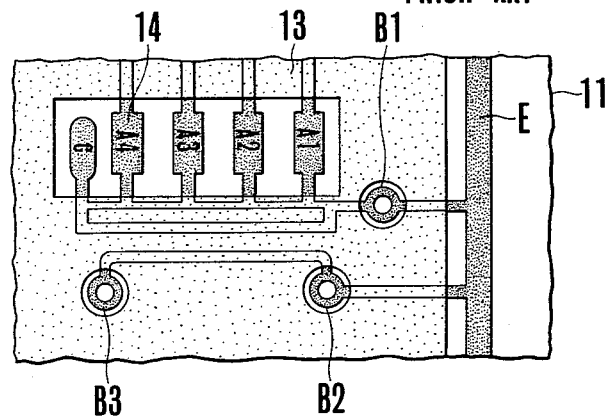
Figure 1D:
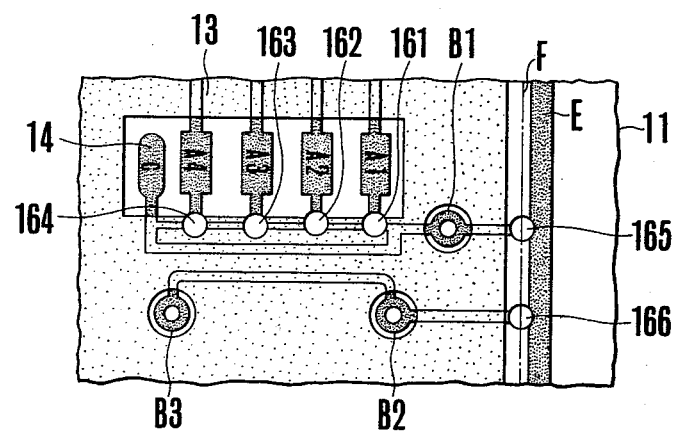
Figure 1E:
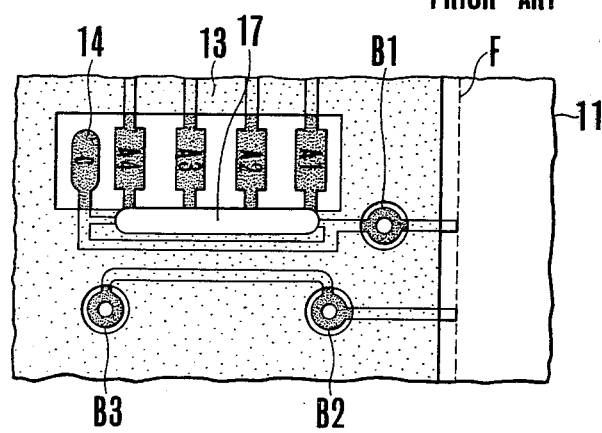
Figure 2A:
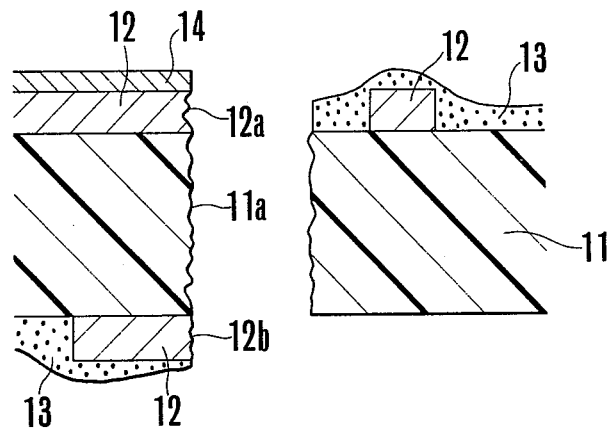
FIGS. 2a, 2b and 2c are partial sectional views showing irregularities formed on the fractured surfaces formed by mechanical working.
Figure 2B:
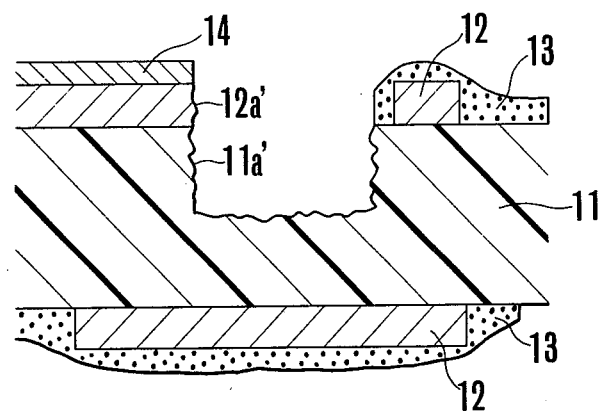
Figure 2C:
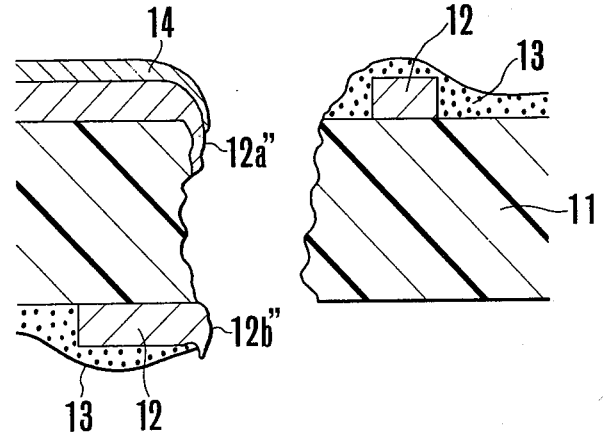
Figure 3A:
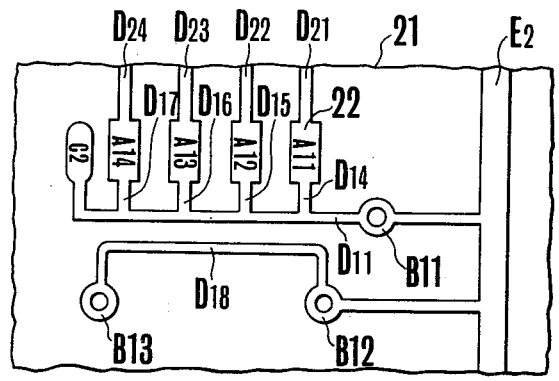
FIGS. 3a through 3f are plan views showing succeeding steps of the method of making a printed circuit board with an overplated coating embodying the present invention.

At first, as shown in FIG. 3a, a copper pattern 22 is formed on an insulating substrate 21 by a well known method, such as a photographic etching method, for example. The cooper pattern 22 comprises contact tabs A11, A12, A13, A14, lands B11, B12 and B13, and a contact tab C2, and these patterns are required to be provided with overplated coatings. In the copper pattern 22, the terminal patterns A11 to A14 are connected to the pad B11 via electroplating leads D14 to D17 and a circuit lead D11. Furthermore, the lands B12 and B13 are interconnected through a circuit lead D18, whereas the lands B11 and B12 are connected to an electroplating lead E2 acting as an overplating terminal. The step shown in FIG. 3a corresponds to that shown in FIG. 1a.

Figure 3B:
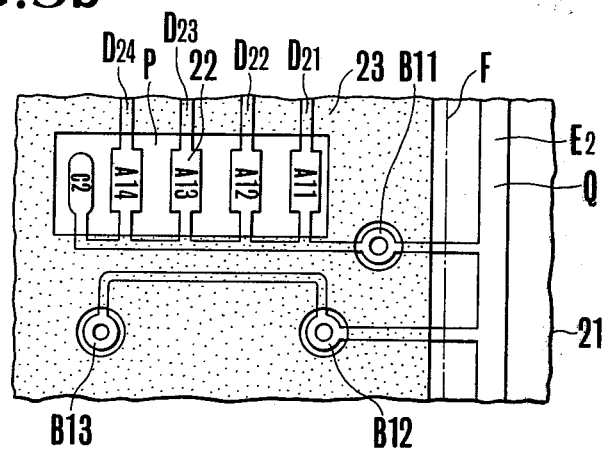
Figure 3C:
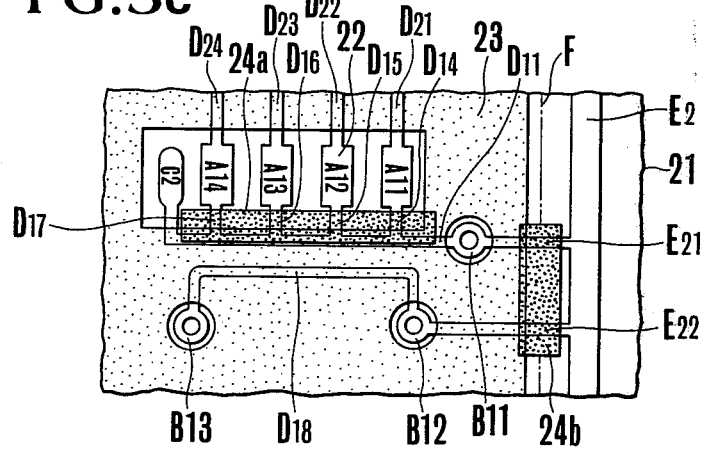

In the step shown in FIG. 3b, a first organic insulating film 23 having a plating resistant property (hereinafter, termed as the first film) is selectively coated on the substrate 21 as shown by a shaded area shown in FIG. 3b, except for the contact regions on the desired portions P and Q of the electroplating leads D14 to D17 and E2. Then, as shown in FIG. 3c, plating resist films 24a and 24b (hereinafter termed as the second films) are coated on the leads D14 to D17 and branch portions E21 and E22 of the lead E2. The above portions of the first film 23 are partially overlapped by the second films 24a and 24b.

Figure 3D:
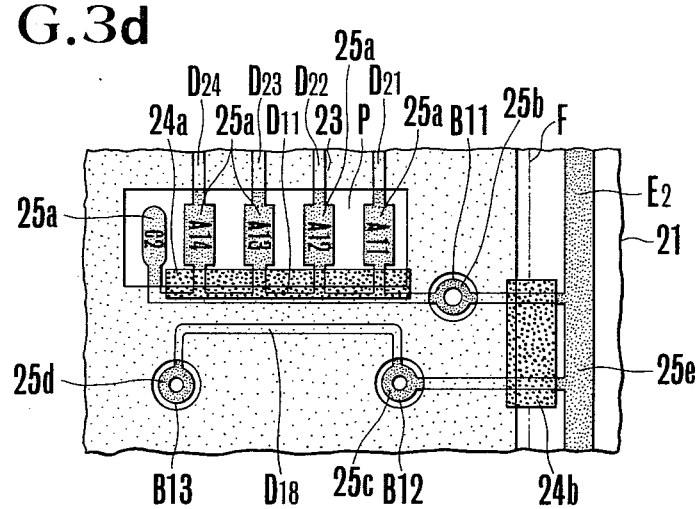

Then, as shown in FIG. 3d, overplated coatings 25a, 25b, 25c, 25d and 25e, for example of gold, solder or a double layer plated coating of gold on nickel are formed on the exposed region of the copper pattern 12. The plating current is supplied through a the electroplating lead E2 formed on the margin area to be removed in the product. Needless to say, the second film 24b may be expanded to cover the entire lead E2.

Figure 3E:
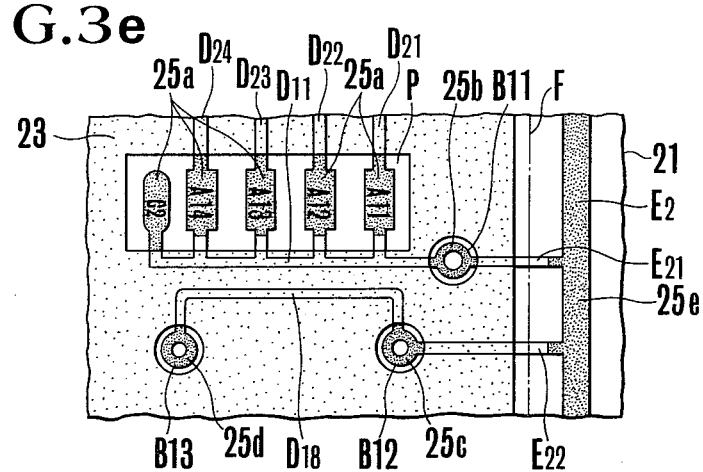
Figure 3F:
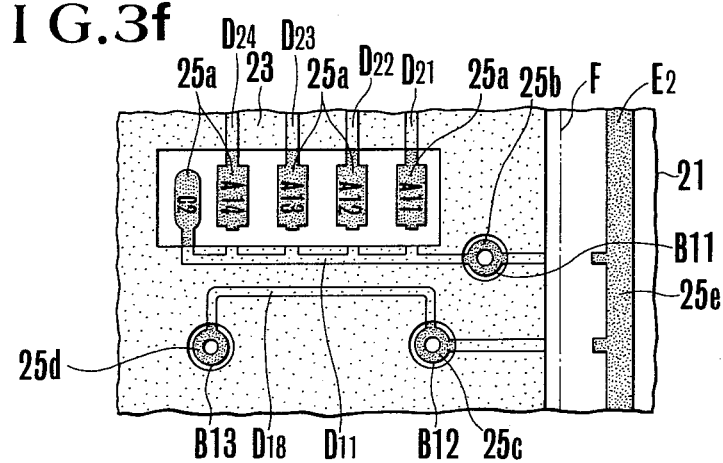

Thereafter, the second films 24a and 24b are removed by dissolving them with a solution comprising organic solvents such as halogenated hydrocarbons, alcohols and esters, or alkaline solutions including caustic soda or caustic potash. Consequently, unplated portion of the electroplating leads D14 to D17, E21 and E22 are exposed as shown in FIG. 3e. Then, those exposed portions are etched off as shown in FIG. 3f.

When the gold on nickel double coatings are applied as the overplated coatings, the exposed copper patterns are removed with well known etching solution such as alkaline etchant and solution containing ammonium peroxysulfate. In a final step to obtain a product, the substrate 21 is cut along the one dot chain line as designated by F.

Figure 4:
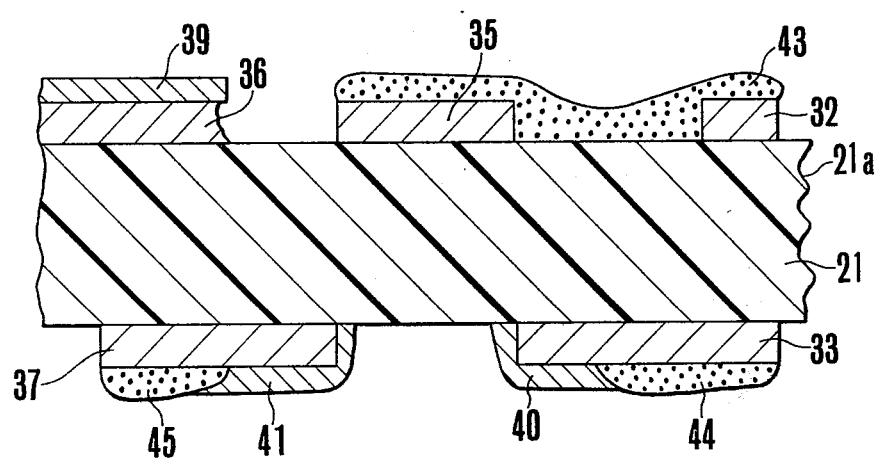
FIG. 4 is an enlarged sectional view showing fractured surfaces formed by the method of this invention.

According to the present invention, as shown in FIG. 4, a contact region 36 coated with overplated metal 39 can be isolated from electroplating lead 35 without fracturing the surfaces of the insulating substrate 21. Another important feature of the invention is that the ends of conductive metal layer 32 and 33 are located apart from the fractured surface 21a of the substrate 21. Accordingly, the layer 32 would never be brought into direct contact with the layer 33 at the time of any mechanical cutting or punching. For this reason, even when the branch portions E21 and E22 in FIG. 3e are closely arranged, there is no possibility of causing short circuit between them at the time of cutting operation along the line F. In FIG. 4, reference numeral 37 designates metal layer, and numerals 40 and 41 designate the overplated coatings. The first resist films are designated by 43, 44 and 45.

In the above embodiment, the contact tabs are arranged in an array pattern and located far from the cutting line F. However, when it is needed to mount the LSI or IC chip on the printed woring board, the above contact tabs are required to be densely arranged around the chip. Furthermore, in view of the feasibility of wire bonding process, it is desirable to equalize the level of the contact regions therebetween. For this reason, a hollow portion corresponding the chip size is formed on the board by means of aforementioned milling cutter after electroplating process. In this case, a common electroplating lead can be arranged so as to form a closed rectangular loop pattern around the portion to be cut by milling wirk. Needless to say, plating current can be supplied by using one of the circuit lead connected to the common loop shaped lead.

Figure 5:
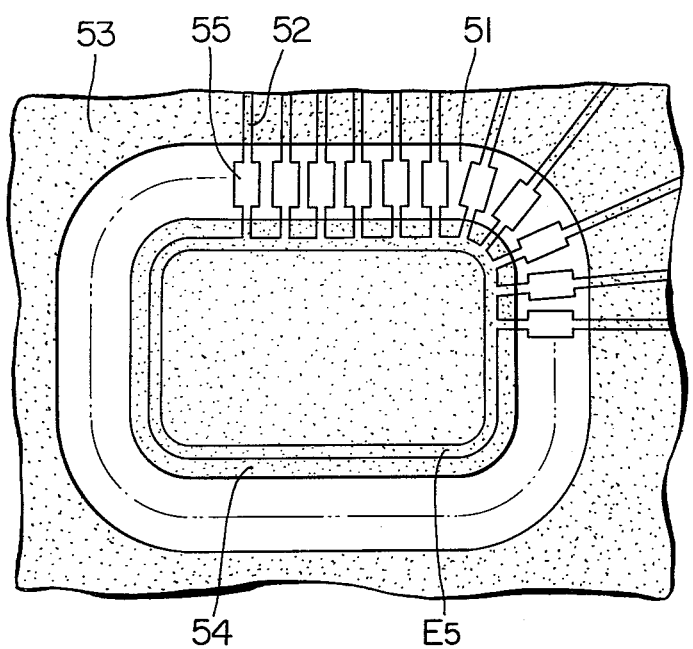
FIG. 5 is an enlarged plan view showing a part of contact regions used for LSI chips according to the present invention.

Referring now FIG. 5, a typical printed wiring board used for the LSI chip is described hereinafter. On a substrate 51 of glass-epoxy laminate, desired copper pattern is formed by conventional well known etching process. A plurality of contact regions 55 and circuit leads 52 are densely arranged around the loop shaped common electroplating lead E5. In FIG. 5, the most part of contact regions 55 and circuit leads 52 are not shown to simplify the drawing. Each contact regions 55 is connected to common lead E5. The first resist film 53 is screenprinted to cover the circuit leads 52 and then treated with heat curing. And the second resist film 54 is screenprinted to cover the common lead E5. After electroplating the exposed contact regions 55 with well known double layer of gold on nickel, the second film 54 is etched off by using solvent such as 1,1,2-trichlorethane, 1,1,1-trichloroethylene and ethylene chloride.

In the next, exposed copper pattern (E5) is etched off by using conventional etching solution. After that, the milling cutting is performed within the area once covered by the second film 54 so as not to contact the overplated region. Preferably, the distance between the overplated end and cutting edge is chosen larger than the distance between adjacent overplated regions. Then the LSI chip is mounted within the hollow portion formed by milling cutting. Thereafter, wire bonding is performed to electrically connect the contact regions therebetween using gold fine wire. On example of the LSI chip size is 5×5 mm and having 64 contact pads.

As for the first film 53, organic material mainly containing epoxy resin is used, which is known as SR-NE 78 manufactured by Taiyo Inku Co. Other adaptable material may be chosen from PC-401 manufactured by Kollmorgen Co.; CCR-232 GV by Asahi Kagaku Kenkyusho; S-222 by Taiyo Inku Co.; and Riston dry film solder mask type 740 FR by Du Pont Co.

As for the second resist film 54, organic material mainly containing polypropylene resin, so called "plating resist" is used, which is known as FRI-950 manufactured by Fuji Yakuhin Kogyo Co. Other adaptable material may be chosen from DCR-2005 by Thiocol Co.; Riston 1215 by Du Pont Co.; and KPR by Kodak Co.

As is apparent from the foregoing description, an important feature of this invention is that two different plating resist films are used to restrict the overplating region, and one of which is not removed, but remained as an eternal solder resist on the final product while the other is removed after overplating process to expose and remove the unplated region, thereby providing a space to allow mechanical cutting without causing short circuit between adjacent overplated regions. Therefore, in the printed wiring board made by present invention, the top end of the overplated contact tab is disposed to the flat portion of the substrate, and the overplated coating does not cover the top end of the base metal. Furthermore, the contact tabs are never coated with resist mask. These features contribute to minimize both the quantity of the used overplated metal and the possibility of short circuit. Thus the densely arranged printed wiring board is easily obtained.

What is claimed is:

1. A method of making a printed wiring board, comprising the steps of:
   preparing an insulating substrate by etching a conductive base pattern thereon, said base pattern consisting of circuit area and electroplating current supply area for electroplating the contact region of said circuit area;
   covering a first plating and etching resistant insulating film on said base pattern except for said contact region and said supply area;
   covering a second plating resistant film on said supply area;
   forming an overplated coating on said exposed contact region by supplying plating current thereto through said supply area;
   removing said second film while allowing said first film to remain intact; and
   selectively etching off only exposed portions of said conductive base pattern in said supply area.

2. The method according to claim 1 wherein said first film is made of organic insulating material.

3. The method according to claim 1 wherein said first film is applied except a lead pattern to be cut.

4. A method of making a printed wiring board, comprising the steps of:
   preparing an insulating substrate by etching a conductive base pattern thereon, said base pattern including a first area to be overplated, a second area to be retained as a part of said printing wiring board, and a third area to be removed;
   covering a first plating and etching resistant insulating film on said second area;
   covering a second plating resistant film on said third area;
   forming an overplated coating on said first area by supplying plating current thereto through said third area;
   removing said second film while allowing said first film to remain intact; and
   selectively etching off said third area.

5. The method according to claim 4 wherein all of said first area, second area and third area are electrically connected.

6. The method according to claims 1 or 4 wherein said conductive base pattern is made of copper.

7. The method according to claims 1 or 4 wherein said overplated coating is either one of a gold layer, a solder layer or a double layer of gold on nickel.

* * * * *